United States Patent
Zhang (10) Patent No.: US 11,074,941 B1
(45) Date of Patent: Jul. 27, 2021

(54) HARD DISK MOUNTING DEVICE

(71) Applicant: ZHENGZHOU YUNHAI INFORMATION TECHNOLOGY CO., LTD., Henan (CN)

(72) Inventor: Wenda Zhang, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 526 days.

(21) Appl. No.: 16/097,178

(22) PCT Filed: Jan. 5, 2018

(86) PCT No.: PCT/CN2018/071563
§ 371 (c)(1),
(2) Date: Oct. 26, 2018

(87) PCT Pub. No.: WO2019/037378
PCT Pub. Date: Feb. 28, 2019

(30) Foreign Application Priority Data

Aug. 24, 2017 (CN) .......................... 201710736778.2

(51) Int. Cl.
*G11B 33/02* (2006.01)
*H05K 5/02* (2006.01)

(52) U.S. Cl.
CPC ........... *G11B 33/022* (2013.01); *H05K 5/023* (2013.01); *H05K 5/0204* (2013.01); *H05K 5/0226* (2013.01)

(58) Field of Classification Search
CPC ....................................................... G06F 1/187
See application file for complete search history.

(56) References Cited

U.S. PATENT DOCUMENTS

2005/0057895 A1* 3/2005 Chen ...................... G06F 1/187
361/679.33
2010/0277861 A1* 11/2010 Roesner .............. G11B 33/128
361/679.33

(Continued)

FOREIGN PATENT DOCUMENTS

CN         102033584 A      4/2011
CN         203595982 U      5/2014

(Continued)

OTHER PUBLICATIONS

International Search Report for PCT/CN2018/071563 dated May 4, 2018, ISA/CN.

*Primary Examiner* — Jerry Wu
(74) *Attorney, Agent, or Firm* — Yue (Robert) Xu; Apex Attorneys at Law, LLP (57) ABSTRACT

A hard disk mounting device includes a hard disk carrier and a carrier fixing device. The hard disk carrier is provided with hard disk positioning studs and carrier positioning studs, and the hard disk positioning studs correspond to hard disk mounting holes in the hard disk. The carrier fixing device includes a left bracket and a right bracket which are symmetrically arranged. L-shaped retaining slots are provided in the left bracket and the right bracket respectively. The position and size of the L-shaped retaining slots correspond to those of the carrier positioning studs. By providing the hard disk carrier and the carrier fixing device, the hard disk is mounted on the hard disk carrier first, and then the hard disk carrier is mounted on the carrier fixing device, and the hard disk is fixed by the hard disk positioning studs.

6 Claims, 7 Drawing Sheets

(56) References Cited

U.S. PATENT DOCUMENTS

2011/0075347 A1  3/2011 Liu
2016/0054767 A1  2/2016 Chen et al.

FOREIGN PATENT DOCUMENTS

| CN | 205809799 U | 12/2016 |
| CN | 106445004 A | 2/2017 |
| CN | 107505996 A | 12/2017 |

* cited by examiner

HARD DISK MOUNTING DEVICE

This application is the national phase of International Application No. PCT/CN2018/071563, titled "HARD DISK MOUNTING DEVICE", filed on Jan. 5, 2018, which claims the benefit of priority to Chinese Patent Application No. 201710736778.2, titled "HARD DISK MOUNTING DEVICE", filed with the State Intellectual Property Office of People's Republic of China on Aug. 24, 2017, the entire disclosures thereof are incorporated herein by reference.

FIELD

The present application relates to the technical field of hard disk installation apparatuses, and in particular to a hard disk mounting device.

BACKGROUND

When to mount a hard disk, the hard disk should generally be fixed to a carrier first, and then the hard disk together with the carrier is mounted into a server. Generally, the hard disk is connected to the carrier by screws, however, for meeting the requirements of quick disassembling of the hard disk, the carrier needs to be designed to permit a tool-free disassembly and assembly. The tool-free disassembly and assembly design needs to ensure that the hard disk can be securely mounted onto the carrier, and also can be assembled and disassembled by hand as much as possible. When the carrier loaded with the hard disk is mounted and fixed into the server, it will occupy a specific cabinet space, and when the available space is limited and a high-density storage configuration is further required, a carrier fixing device needs to be specially designed to meet the demands.

SUMMARY

In view of the above situations, a hard disk mounting device is proposed according to the present application, which can realize tool-free disassembly and assembly, quick assembly and disassembly of the hard disk, and a high-density storage layout.

The technical solution according to the present application for addressing the technical issues is as follows. In one aspect, a hard disk mounting device is provided according to an embodiment of the present application, which includes a hard disk carrier and a carrier fixing device. The hard disk carrier is provided with hard disk positioning studs and carrier positioning studs, and the hard disk positioning studs correspond to hard disk mounting holes in the hard disk. The carrier fixing device includes a left bracket and a right bracket which are symmetrically arranged. L-shaped retaining slots are respectively provided in the left bracket and the right bracket. The position and size of the L-shaped retaining slots correspond to those of the carrier positioning studs respectively. By providing the hard disk carrier and the carrier fixing device, the hard disk is mounted on the hard disk carrier first, and then the hard disk carrier is mounted on the carrier fixing device, and the hard disk is fixed by the hard disk positioning studs. The carrier positioning studs are retained into the L-shaped retaining slots to secure the hard disk carrier to the carrier fixing device.

As an optimization, the hard disk carrier includes a support member and two movable members. The support member includes a support member bottom plate and two support member side plates respectively vertically arranged at two sides of the support member bottom plate. Each of the movable members has an elongated shape, and is arranged at an inner side of the respective support member side plate. The movable member has one end connected to one end of the support member side plate by a rotating shaft a. One end, away from the rotating shaft a, of the movable member is provided with a positioning hole, and the support member side plate is provided with an elastic strip corresponding to the positioning hole, and a terminal end of the elastic strip is provided with a convex bump. The hard disk positioning studs are provided on a side, towards a center of the support member, of the movable member, and the carrier positioning studs are provided on a side, opposite to the center of the support member, of the movable member. One end of the movable member is provided with a rotating shaft rivet hole, and one end of the support member side plate is provided with a mounting hole. The rotating shaft a is passed through the mounting hole and the rotating shaft rivet hole to rivet the movable member and the support member together, and the movable member is rotatable about the axis of the rotating shaft a. The position-limiting control to the movable member may be achieved by engaging the convex bump into the positioning hole or disengaging the convex bump from the positioning hole. When the movable member rotates toward the support member bottom plate of the support member to be in full contact with the support member bottom plate, the convex bump is engaged into the positioning hole. Since the convex bump is small, the movable member can be disengaged from the convex bump by applying a small external force.

As an optimization, the support member bottom plate is provided with a damping sheet a; a side, facing towards the center of the support member, of the movable member is provided with a damping sheet b. The damping sheet b is provided with avoidance holes corresponding to the hard disk positioning studs. The movable member is provided with the corresponding rivet holes for the hard disk positioning studs, and rivet holes for the carrier positioning studs.

As an optimization, the left bracket includes a left bracket bottom plate and a left bracket side plate. The left bracket side plate is provided with a left bracket convex bump and a left bracket mounting hole. The right bracket includes a right bracket bottom plate and a right bracket side plate. The right bracket side plate is provided with a right bracket convex bump and a right bracket mounting hole. The left bracket of one hard disk carrier fixing device is in contact with the right bracket of an adjacent hard disk carrier fixing device. The left bracket convex bump and the right bracket convex bump fit closely to each other, and are connected through the left bracket mounting hole and the right bracket mounting hole, and the left bracket bottom plate and the right bracket bottom plate are configured to be fixed to a cabinet base.

As an optimization, the carrier fixing device further includes a position-limiting handle and a handle bracket. The position-limiting handle is mounted on the handle bracket by means of a rotating shaft b. The position-limiting handle is provided with a handle rubber pad on a side adjacent to the left bracket and the right bracket.

As an optimization, the handle bracket includes a handle bracket bottom plate and a handle bracket side plate. The handle bracket bottom plate is connected to the cabinet base. The handle bracket side plate is provided with a handle bracket convex bump, and the handle bracket convex bump is provided with a handle bracket rivet hole. One end of the position-limiting handle is provided with a position-limiting handle mounting hole, and the rotating shaft b passes through the position-limiting handle mounting hole and the handle bracket rivet hole.

As an optimization, the position-limiting handle is U-shaped. After the position-limiting handle is lowered, an end, away from the rotating shaft b, of the position-limiting handle is in contact with the cabinet base. At this time, the upper cover of the cabinet is mounted, and the upper cover of the cabinet is pressed against the position-limiting handle to restrict the rotation of the position-limiting handle As an optimization, the position-limiting handle is further provided with a flanging. The upper cover of the cabinet is pressed against the flanging of the position-limiting handle to restrict the rotation of the position-limiting handle.

The effects provided in the summary of the present application are merely the effects of the embodiments, rather than all of the effects of the present application, and the above technical solutions have the following advantages or benefits:

1. By providing the movable member and arranging the hard disk positioning studs on the movable member, the mounting of the hard disk on the hard disk carrier is facilitated.

2. With the arrangement that the left bracket of one hard disk carrier fixing device and the right bracket of an adjacent hard disk carrier fixing device are in contact with each other and connected to each other, the requirement of high-density storage configuration in a limited space is met.

3. By providing the damping sheet a and the damping sheet b, the stability of the hard disk is improved.

4. By providing the handle rubber pad and attaching the handle rubber pad against the hard disk, the sliding of the hard disk carrier in the retaining slot is restricted, thereby realizing the mounting and fixing of the hard disk carrier.

5. By providing the flanging of the position-limiting handle to allow the upper cover of the cabinet to be in contact with the wide surface of the flanging, damages to the upper cover of the cabinet can be avoided.

REFERENCE NUMERALS IN FIGS. 1 TO 7

1. support member,
11. support member bottom plate,
111. damping sheet a,
12. support member side plate,
121. elastic strip,
122. convex bump,
123. mounting hole,
13. rotating shaft a,
2. movable member,
20. damping sheet b,
201. avoidance hole,
21. positioning hole,
22. rivet hole for a hard disk positioning stud,
220. hard disk positioning stud,
23. rivet hole for a carrier positioning stud,
230. carrier positioning stud,
24. rotating shaft rivet hole,
3. hard disk,
31. hard disk mounting hole,
41. left bracket,
411. left bracket bottom plate,
412. left bracket side plate,
4121. left bracket convex bump,
4122. left bracket mounting hole,
413. L-shaped retaining slot,
42. right bracket,
421. right bracket bottom plate,
422. right bracket side plate,
4221. right bracket convex bump,
4222. right bracket mounting hole,
43. handle bracket,
431. handle bracket bottom plate,
432. handle bracket side plate,
433. handle bracket convex bump,
434. rivet hole for the handle bracket,
44. position-limiting handle,
441. position-limiting handle mounting hole,
442. flanging of the position-limiting handle,
45. rotating shaft b,
46. handle rubber pad,
8. cabinet, and
81. cabinet base.

DETAILED DESCRIPTION

In order to clearly illustrate the technical features of the solution according to the present application, the present application is described in detail hereinafter through specific embodiments and with reference to the drawings. The disclosure hereinafter provides many different embodiments or examples for implementing different structures of the present application. In order to simplify the disclosure of the present application, the components and arrangements of specific examples are described hereinafter. Furthermore, reference numerals and/or letters may be repeatedly used in different examples according to the present application. This repetition is for the purpose of simplification and clarity, and does not in itself indicate the relationship between the various discussed embodiments and/or arrangements. It should be noted that the components illustrated in the drawings are not necessarily drawn to scale. The description of the known components and processing techniques and processes is omitted in the present application to avoid unnecessarily limiting the application.

An embodiment of the present application is shown in FIGS. 1 to 7. As shown in the figures, a hard disk mounting device includes a hard disk carrier and a carrier fixing device. The hard disk carrier is provided with hard disk positioning studs 220 and carrier positioning studs 230. The hard disk positioning studs 220 correspond to hard disk mounting holes 31 in a hard disk 3. The carrier fixing device includes a left bracket 41 and a right bracket 42. The left bracket 41 and the right bracket 42 are symmetrically arranged. The left bracket 41 and the right bracket 42 are each provided with an L-shaped retaining slot 413. The position and size of the L-shaped retaining slot 413 correspond to those of the carrier positioning stud 230. By providing the hard disk carrier and the carrier fixing device, the hard disk 3 is mounted on the hard disk carrier first, and then the hard disk carrier is mounted on the carrier fixing device, and the hard disk 3 is fixed by the hard disk positioning studs 220. The carrier positioning studs 230 are retained into the L-shaped retaining slots 413 to secure the hard disk carrier onto the carrier fixing device.

Figure 1:
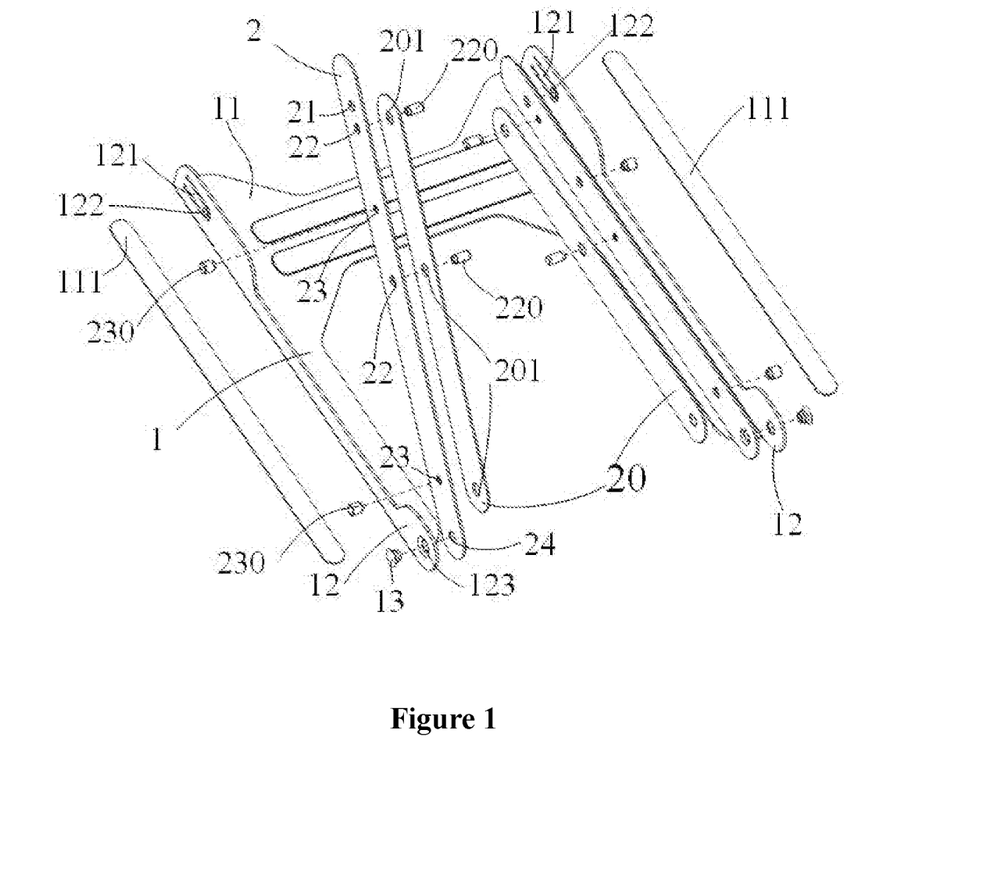
FIG. 1 is an exploded view of an embodiment of a hard disk carrier.
Figure 2:
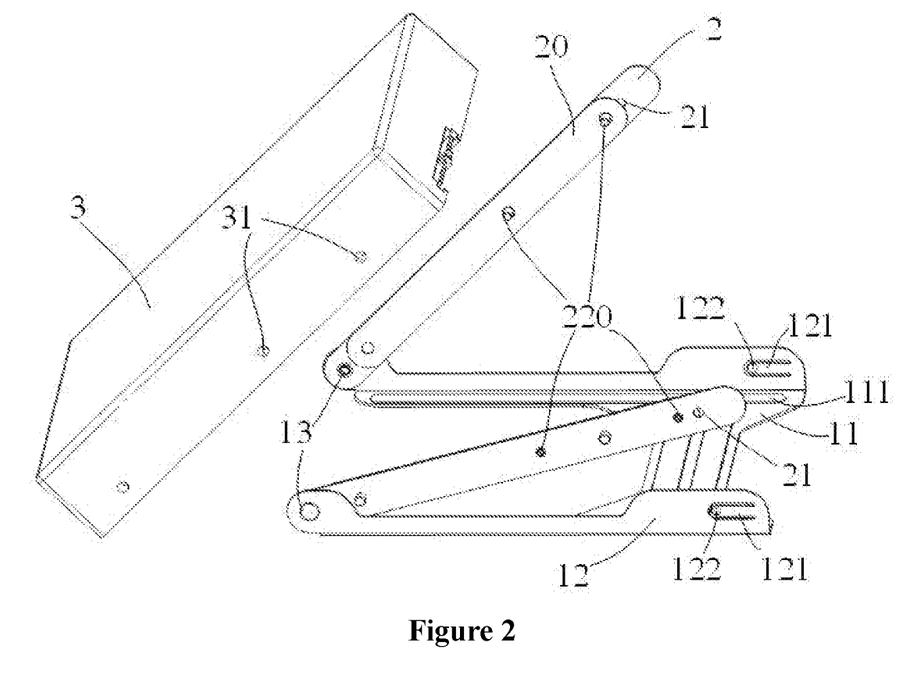
FIG. 2 is a schematic view showing that a hard disk is being mounted on the hard disk carrier.
Figure 3:
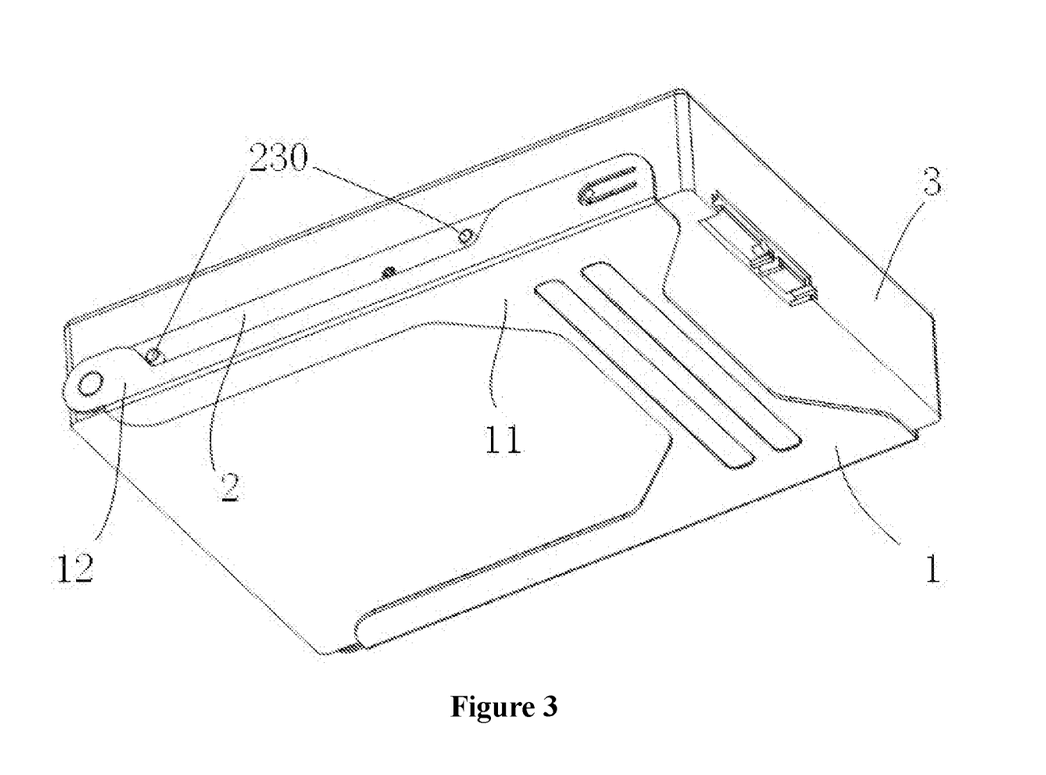
FIG. 3 is a schematic view showing that the hard disk has been mounted on the hard disk carrier.

As shown in FIGS. 1 to 3, the hard disk carrier includes a support member 1 and two movable members 2. The support member 1 includes a support member bottom plate 11 and two support member side plates 12 respectively vertically arranged at two sides of the support member bottom plate 11. The movable member 2 has an elongated shape, and is arranged at an inner side of the support member side plate 12, and one end of the movable member 2 is connected to one end of the support member side plate 12 by a rotating shaft a 13. One end, away from the rotating shaft a 13, of the movable member 2 is provided with a positioning hole 21, and the support member side plate 12 is provided with an elastic strip 121 corresponding to the positioning hole 21. A terminal end of the elastic strip 121 is provided with a convex bump 122. A side, towards the center of the support member 1, of the movable member 2 is provided with the hard disk positioning studs 220, and a side, opposite to the center of the support member 1, of the movable member 2 is provided with the carrier positioning studs 230. One end of the movable member 2 is provided with a rotating shaft rivet hole 24, and one end of the support member side plate 12 is provided with a mounting hole 123. The rotating shaft a 13 passes through the mounting hole 123 and the rotating shaft rivet hole 24 to rivet the movable member 2 and the support member 1 together, and the movable member 2 is rotatable about the axis of the rotating shaft a 13. The position-limiting control to the movable member 2 may be achieved by engaging the convex bump 122 into the positioning hole 21 or disengaging the convex bump 122 from the positioning hole 21. When the movable member 2 rotates towards the support member bottom plate 11 of the support member 1 to be in full contact with the support member bottom plate 11, the convex bump 122 is engaged into the positioning hole 21. Since the convex bump 122 is small, the movable member 2 can be disengaged from the convex bump 122 by applying a small external force. By providing the movable member 2 and arranging the hard disk positioning studs 220 on the movable member 2, the mounting of the hard disk 3 on the hard disk carrier is facilitated.

The support member bottom plate 11 is provided with a damping sheet a 111, and a side, facing towards the center of the support member 1, of the movable member 2 is provided with a damping sheet b 20. The damping sheet b 20 is provided with avoidance holes 201 corresponding to the hard disk positioning studs 220. The movable member 2 is provided with corresponding rivet holes 22 for the hard disk positioning studs and rivet holes 23 for the carrier positioning studs. By providing the damping sheet a 111 and the damping sheet b 20, the stability of the hard disk 3 is improved.

Figure 4:
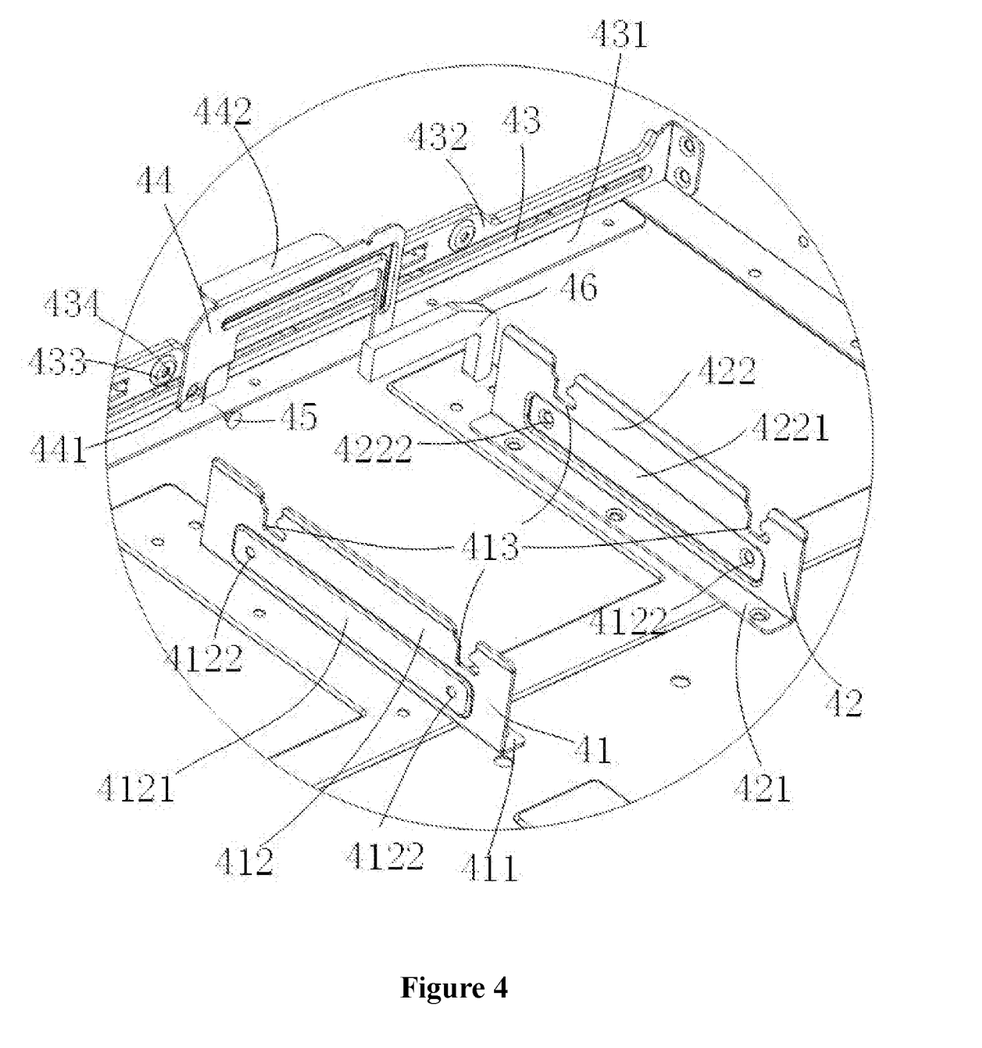
FIG. 4 is an overall structural view of a carrier fixing device.

As shown in FIG. 4, the left bracket 41 includes a left bracket bottom plate 411 and a left bracket side plate 412. The left bracket side plate 412 is provided with a left bracket convex bump 4121 and a left bracket mounting hole 4122. The right bracket 42 includes a right bracket bottom plate 421 and a right bracket side plate 422. The right bracket side plate 422 is provided with a right bracket convex bump 4221 and a right bracket mounting hole 4222. The left bracket 41 of one hard disk carrier fixing device is in contact with the right bracket 42 of an adjacent hard disk carrier fixing device. The left bracket convex bump 4121 and the right bracket convex bump 4221 fit closely to each other, and are connected through the left bracket mounting hole 4122 and the right bracket mounting hole 4222. The left bracket bottom plate 411 and the right bracket bottom plate 421 are used to be fixed to a cabinet base 81. With the arrangement that the left bracket 41 of one hard disk carrier fixing device and the right bracket 42 of an adjacent hard disk carrier fixing device are in contact with each other and connected to each other, the requirement of high-density storage configuration in a limited space is met.

The carrier fixing device further includes a position-limiting handle 44 and a handle bracket 43. The position-limiting handle 44 is mounted on the handle bracket 43 by means of a rotating shaft b 45. A side, adjacent to the left bracket 41 and the right bracket 42, of the position-limiting handle 44 is provided with a handle rubber pad 46. By providing the handle rubber pad 46 and allowing the handle rubber pad 46 to abut against the hard disk 3, the sliding of the hard disk carrier in the retaining slot is restricted, thereby realizing the mounting and fixing of the hard disk carrier.

The handle bracket 43 includes a handle bracket bottom plate 431 and a handle bracket side plate 432. The handle bracket bottom plate 431 is connected to the cabinet base 81. The handle bracket side plate 432 is provided with a handle bracket convex bump 433, and the handle bracket convex bump 433 is provided with a handle bracket rivet hole 434. One end of the position-limiting handle 44 is provided with a position-limiting handle mounting hole 441, and the rotating shaft b 45 passes through the position-limiting handle mounting hole 441 and the handle bracket rivet hole 434.

The position-limiting handle 44 is U-shaped. After the position-limiting handle 44 is lowered, an end, away from the rotating shaft b 45, of the position-limiting handle 44 is in contact with the cabinet base 81. At this time, the upper cover of the cabinet is mounted, and the upper cover of the cabinet is pressed against the position-limiting handle 44 to restrict the rotation of the position-limiting handle 44.

Figure 6:
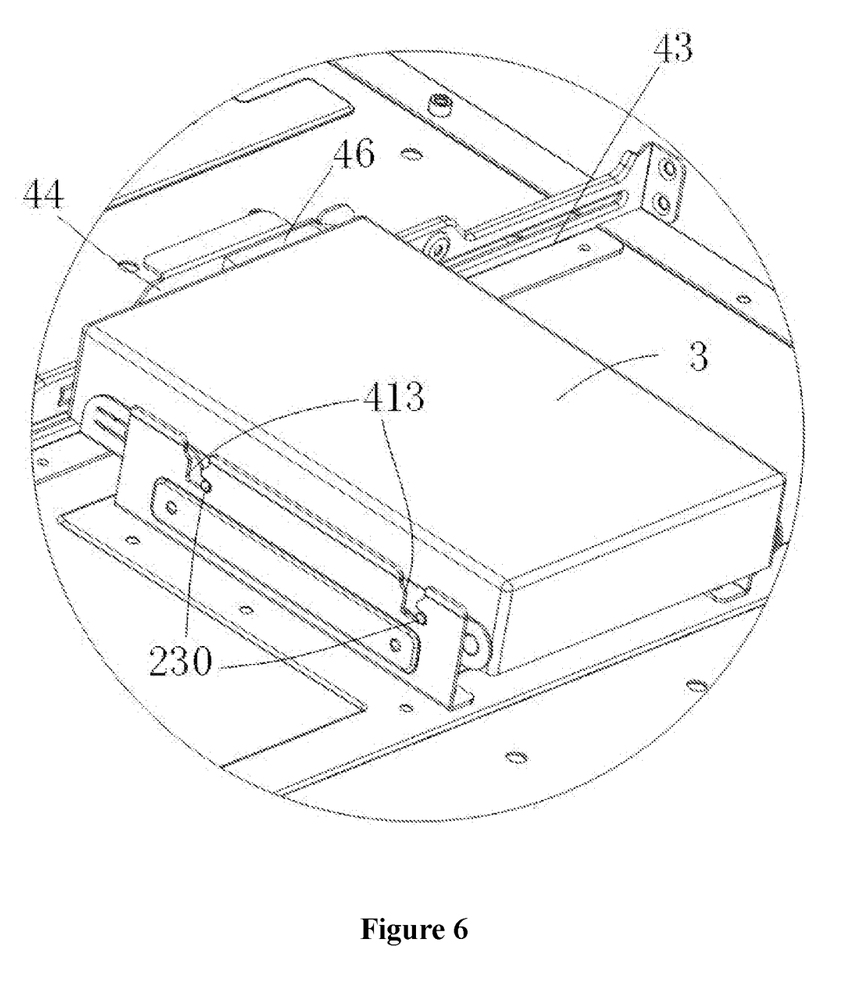
FIG. 6 is a schematic view showing that the hard disk carrier is mounted in place.

As shown in FIG. 6, the position-limiting handle 44 is further provided with a flanging 442. The upper cover of the cabinet is pressed against the flanging 442 of the position-limiting handle to restrict the rotation of the position-limiting handle 44. By providing the flanging 442 of the position-limiting handle, the upper cover of the cabinet is in contact with the wide surface of the flanging 442 of the position-limiting handle, thereby avoiding damages to the upper cover of the cabinet.

FIG. 2 is a schematic view showing that a hard disk is being mounted on the hard disk carrier. When to mount the hard disk 3, the two movable members 2 are expanded by a certain angle first, and then the hard disk positioning studs 220 are engaged into the hard disk mounting holes 31 at two sides of the hard disk 3, and then each of the movable members 2 is rotated, to allow the positioning hole 21 thereof to be caught on the convex bump 122 of the elastic strip 121 of the respective support member side plate 12, thus completing the mounting of the hard disk 3 on the hard disk carrier. When the hard disk needs to be removed, the movable members 2 are rotated to disengage the convex bumps 122 from the positioning holes 21, and then the hard disk 3 can be just removed.

Figure 5:
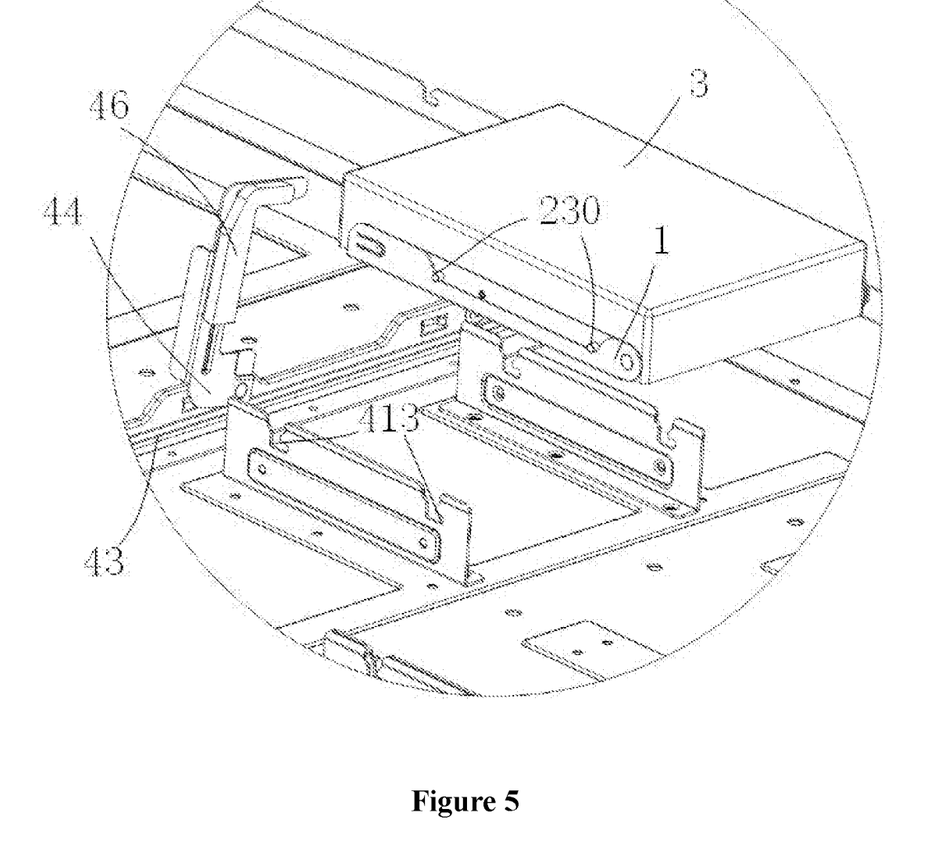
FIG. 5 is a schematic view showing that the hard disk carrier is being mounted on the carrier fixing device.

Referring to FIG. 5, when to mount the hard disk carrier, the position-limiting handle 44 is opened first, and then the hard disk carrier is mounted between the left bracket 41 and the right bracket 42. In mounting, the carrier position-limiting studs 230 are moved downward to be retained in the L-shaped retaining slots 413 first, and then are slid backward to be in place, and finally the position-limiting handle 44 is closed. Referring to FIG. 6, when the carrier is mounted in place, the handle rubber pad 46 on the position-limiting handle 44 will abut against the hard disk 3, thereby restricting the movement of the carrier in the forward and backward direction.

Figure 7:
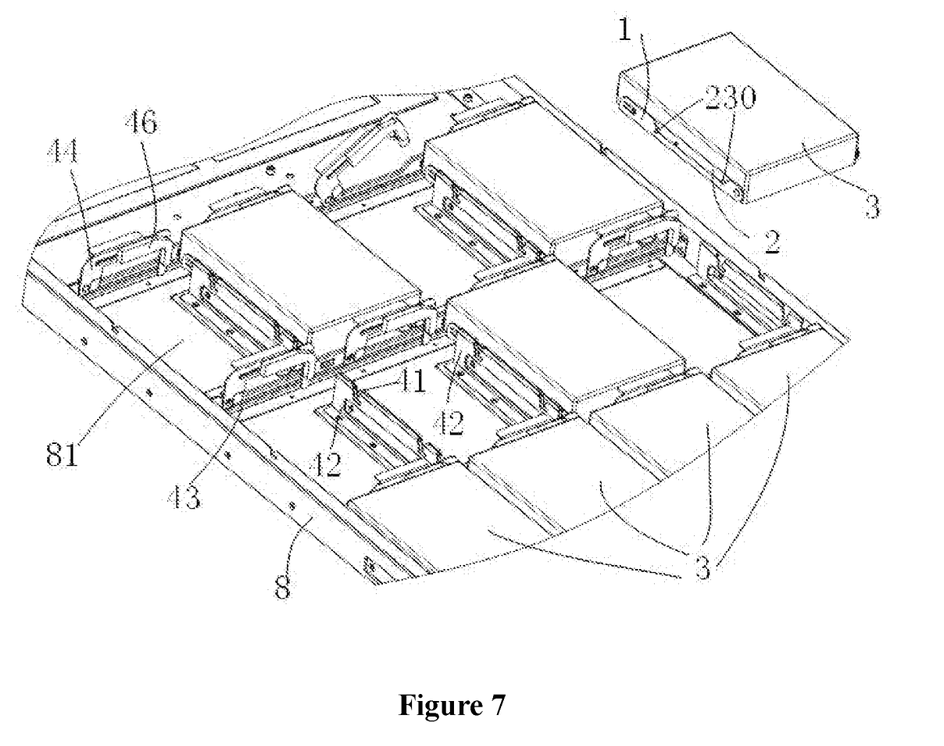
FIG. 7 is a schematic view showing a high-density storage layout of a cabinet using the hard disk mounting device.

Referring to FIG. 7, multiple sets of the hard disk carriers and fixing devices thereof can be used to realize the high-density storage disposition in the cabinet 8.

A hard disk mounting device according to the present application can realize the tool-free disassembly and assembly of the hard disk on the hard disk carrier conveniently and quickly, and the structural design of the carrier fixing device is simple and compact, and the hard disk damping effect is good. The hard disk mounting device according to the present application, compared with the conventional design, saves a lot of spaces, and thus can meet the requirement of high-density storage configuration in a limited space.

Though the embodiments of the present application are described with reference to the drawings, but they are not intended to limit the scope of the present application, and on the basis of the technical solution of the present application, various modifications or variations may be made by the person skilled in the art without making creative efforts, and those modifications or variations should also be deemed to fall into the scope of protection of the present application.

The invention claimed is:

1. A hard disk mounting device, comprising a hard disk carrier and a carrier fixing device, wherein the hard disk carrier is provided with hard disk positioning studs and carrier positioning studs, and the hard disk positioning studs correspond to hard disk mounting holes in the hard disk; the carrier fixing device comprises a left bracket and a right bracket which are symmetrically arranged, L-shaped retaining slots are respectively provided in the left bracket and the right bracket, and the position and size of the L-shaped retaining slots correspond to the position and size of the carrier positioning studs respectively; and the hard disk carrier comprises a support member and two movable members, the support member comprises a support member bottom plate and two support member side plates respectively vertically arranged at two sides of the support member bottom plate, each of the movable members has an elongated shape, and is arranged at an inner side of the respective support member side plate, the movable member has one end connected to one end of the support member side plate by a rotating shaft; another opposite end, away from the rotating shaft, of the movable member is provided with a positioning hole, and the support member side plate is provided with an elastic strip corresponding to the positioning hole; a terminal end of the elastic strip is provided with a convex bump, and the hard disk positioning studs are provided at a side, towards a center of the support member, of the movable member, and the carrier positioning studs are provided at a side, opposite to the center of the support member, of the movable member; and the carrier fixing device further comprises a position-limiting handle and a handle bracket, the position-limiting handle is mounted on the handle bracket by a rotating shaft, and the position-limiting handle is provided with a handle rubber pad on a side adjacent to the left bracket and the right bracket; and the handle bracket comprises a handle bracket bottom plate and a handle bracket side plate, the handle bracket bottom plate is connected to a cabinet base.

2. The hard disk mounting device according to claim 1, wherein the support member bottom plate is provided with a damping sheet a; and the movable member is provided with a damping sheet b at a side facing towards the center of the support member.

3. The hard disk mounting device according to claim 1, wherein the left bracket comprises a left bracket bottom plate and a left bracket side plate; the left bracket side plate is provided with a left bracket convex bump and a left bracket mounting hole; the right bracket comprises a right bracket bottom plate and a right bracket side plate, and the right bracket side plate is provided with a right bracket convex bump and a right bracket mounting hole.

4. The hard disk mounting device according to claim 1, wherein the handle bracket side plate is provided with a handle bracket convex bump, and the handle bracket convex bump is provided with a handle bracket rivet hole, one end of the position-limiting handle is provided with a position-limiting handle mounting hole, and the rotating shaft passes through the position-limiting handle mounting hole and the handle bracket rivet hole.

5. The hard disk mounting device according to claim 1, wherein the position-limiting handle is U-shaped.

6. The hard disk mounting device according to claim 1, wherein the position-limiting handle is further provided with a flanging of the position-limiting handle.

\* \* \* \* \*